United States Patent
Yoon

(10) Patent No.: US 10,115,849 B2
(45) Date of Patent: Oct. 30, 2018

(54) SOLAR CELL AND METHOD OF FABRICATING THE SAME

(71) Applicant: LG INNOTEK CO., LTD., Seoul (KR)

(72) Inventor: Hee Kyung Yoon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 26 days.

(21) Appl. No.: 14/406,030

(22) PCT Filed: Aug. 23, 2013

(86) PCT No.: PCT/KR2013/007602
§ 371 (c)(1),
(2) Date: Dec. 5, 2014

(87) PCT Pub. No.: WO2014/030980
PCT Pub. Date: Feb. 27, 2014

(65) Prior Publication Data
US 2015/0155406 A1    Jun. 4, 2015

(30) Foreign Application Priority Data

Aug. 23, 2012  (KR) ......................... 10-2012-0092418

(51) Int. Cl.
*H01L 31/18* (2006.01)
*H01L 31/0392* (2006.01)
(Continued)

(52) U.S. Cl.
CPC .. *H01L 31/03925* (2013.01); *H01L 31/02167* (2013.01); *H01L 31/022425* (2013.01);
(Continued)

(58) Field of Classification Search
CPC ........... H01L 31/02167; H01L 31/0749; H01L 31/022441; H01L 31/03925; H01L 31/18;
(Continued)

(56) References Cited

U.S. PATENT DOCUMENTS

| 5,981,868 A | 11/1999 | Kushiya et al. |
| 8,048,707 B1 | 11/2011 | Miasole |

(Continued)

FOREIGN PATENT DOCUMENTS

| CN | 102337516 A | 2/2012 |
| JP | 2006-525671 A | 11/2006 |

(Continued)

OTHER PUBLICATIONS

Bar et al., "Formation of a ZnS/Zn(S,O) bilayer buffer on CuInS2 thin film solar cell absorbers by chemical bath deposition", Journal of Applied Physics, 2006.*

(Continued)

*Primary Examiner* — Matthew T Martin
(74) *Attorney, Agent, or Firm* — LRK Patent Law Firm

(57) ABSTRACT

A solar cell includes a substrate, a back electrode layer on the substrate, a light absorbing layer on the back electrode layer, a buffer layer on the light absorbing layer, and a front electrode layer on the buffer layer. The buffer layer includes at least one of zinc sulfide (ZnS), zinc oxide (ZnO) and zinc hydroxide ($Zn(OH)_2$). A method of fabricating the solar cell includes forming a back electrode layer on a substrate, forming a light absorbing layer on the back electrode layer, forming a first buffer layer on the light absorbing layer, and forming a second buffer layer on the first buffer layer. The first buffer layer or the second buffer layer includes at least one of zinc sulfide (ZnS), zinc oxide (ZnO), and zinc hydroxide ($Zn(OH)_2$).

8 Claims, 2 Drawing Sheets

(51) Int. Cl.
  *H01L 31/0216* (2014.01)
  *H01L 31/0749* (2012.01)
  *H01L 31/0224* (2006.01)
  *H01L 31/046* (2014.01)

(52) U.S. Cl.
  CPC .. *H01L 31/022441* (2013.01); *H01L 31/0392* (2013.01); *H01L 31/046* (2014.12); *H01L 31/0749* (2013.01); *H01L 31/18* (2013.01); *Y02E 10/541* (2013.01)

(58) Field of Classification Search
  CPC ......... H01L 31/022425; H01L 31/0392; H01L 31/1828; Y02E 10/52; Y02E 10/541
  See application file for complete search history.

(56) References Cited

U.S. PATENT DOCUMENTS

| | | | |
|---|---|---|---|
| 2006/0180200 A1 | 8/2006 | Platzer Bjorkman et al. | |
| 2009/0191359 A1* | 7/2009 | Bhattacharya | H01L 31/0296 427/560 |
| 2011/0081744 A1* | 4/2011 | Kawano | 438/95 |
| 2013/0071966 A1* | 3/2013 | Avachat | H01L 31/0296 438/95 |

FOREIGN PATENT DOCUMENTS

| | | |
|---|---|---|
| KR | 10-2008-0009346 A | 1/2008 |
| WO | 2012/054476 A2 | 4/2012 |

OTHER PUBLICATIONS

Search Report for International Application No. PCT/KR2013/007602.

SIPO Office Action for Chinese Patent Application No. 201380043901.2.

M. Bar, et al. "Formation of a ZnS/Zn (S, O) bilayer buffer on CuInS2 thin film solar cell absorbers by chemical bath deposition." Journal of applied physics, vol. 99, No. 12, Jun. 2006.

KIPO Office Action for Korean Application No. 10-2012-0092418 dated Feb. 20, 2018.

A. Ennaoui et al., "Highly-efficient Cd-free CuInS2 Thin-film Solar Cells and Mini-modules with Zn(S,O) Buffer Layers Prepared by an Alternative Chemical Bath Process", Prog. Photovolt: Res. Appl. 2006; 14:499-511 (Feb. 17, 2006).

R. Saez-Araoz et al., "In situ monitoring the growth of thin-film ZnS/Zn(S,O) bilayer on Cu-chalcopyrite for high performance thin film solar cells", Thin Solid Films, vol. 517, pp. 2300-2304 (Nov. 12, 2008).

\* cited by examiner

[Fig. 1]
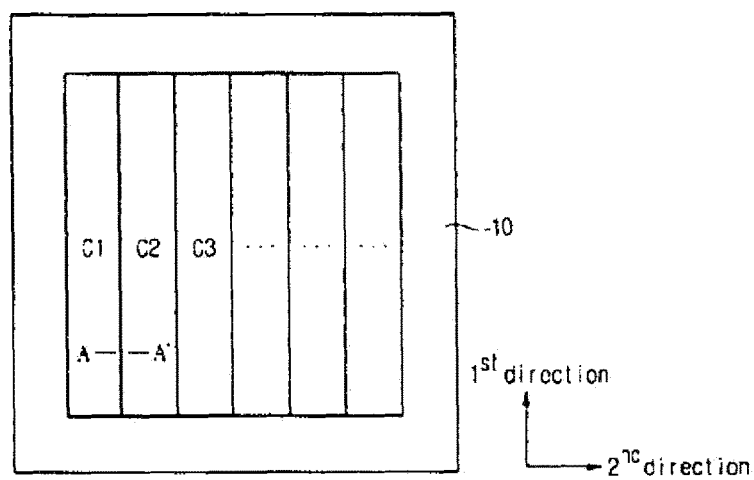
[Fig. 2]
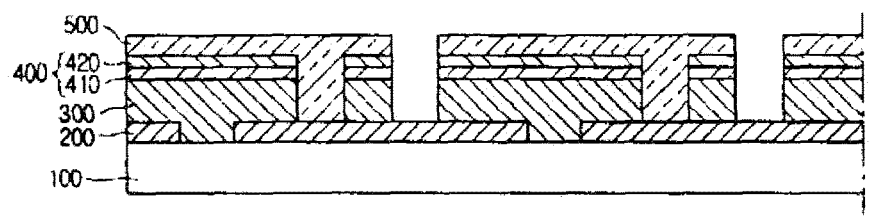
[Fig. 3]
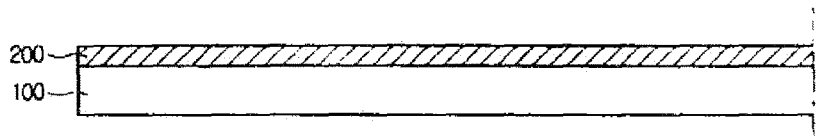
[Fig. 4]
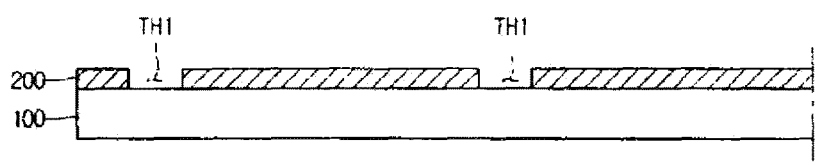
[Fig. 5]
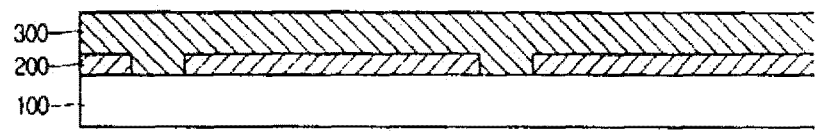
[Fig. 6]
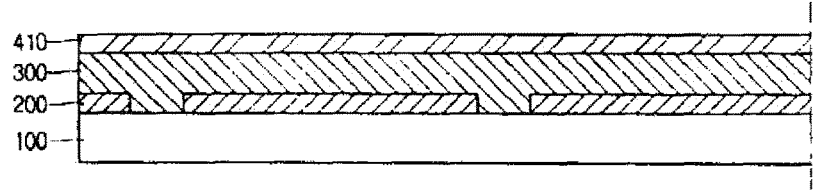

[Fig. 7]
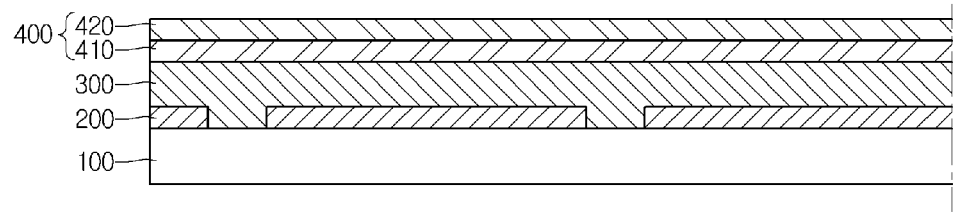
[Fig. 8]
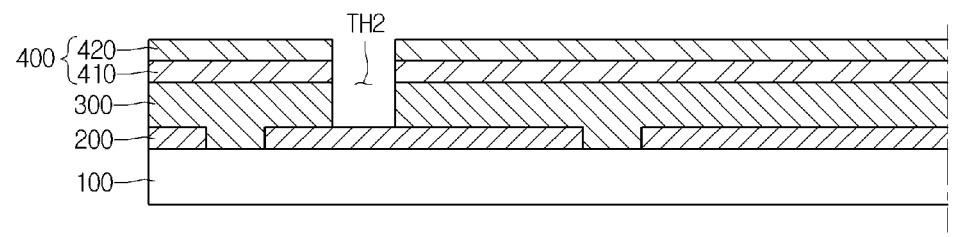
[Fig. 9]
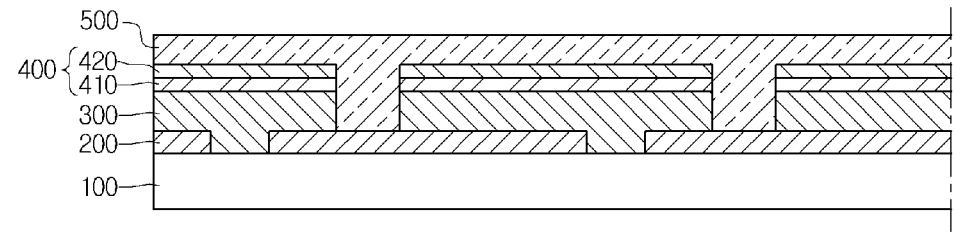
[Fig. 10]
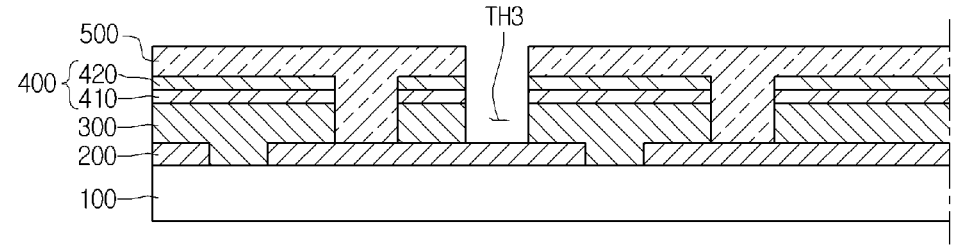

SOLAR CELL AND METHOD OF FABRICATING THE SAME

TECHNICAL FIELD

The embodiment relates to a solar cell and a method of fabricating the same.

BACKGROUND ART

A method of fabricating a solar cell for solar light power generation is as follows. First, after preparing a substrate, a back electrode layer is formed on the substrate, and patterned by a laser to form a plurality of back electrodes.

Thereafter, a light absorbing layer, a buffer layer, and a high resistance buffer layer are sequentially formed on the back electrodes. A scheme of forming a Cu(In,Ga)Se2 (CIGS) based-light absorbing layer by simultaneously or separately evaporating copper (Cu), indium (In), gallium (Ga), and selenium (Se) and a scheme of performing a selenization process after a metallic precursor film has been formed, have been extensively used in order to form the light absorbing layer. The energy bandgap of the light absorbing layer is in the range of about 1 eV to 1.8 eV.

Then, the buffer layer including cadmium sulfide (CdS) is formed on the light absorbing layer through a sputtering process. The energy bandgap of the buffer layer may be in the range of about 2.2 eV to 2.4 eV. After that, the high resistance buffer layer including zinc oxide (ZnO) is formed on the buffer layer through the sputtering process. The energy bandgap of the high resistance buffer layer is in the range of about 3.1 eV to 3.3 eV.

Thereafter, holes patterns may be formed in the light absorbing layer, the buffer layer, and the high resistance buffer layer.

Then, a transparent conductive material is laminated on the high resistance buffer layer, and the hole patterns are filled with the transparent conductive material. Accordingly, a transparent electrode layer is formed on the high resistance buffer layer, and connection wires are formed inside the holes patterns. A material constituting the transparent electrode layer and the connection wires may include aluminum doped zinc oxide (AZO). The energy bandgap of the transparent electrode layer may be in the range of about 3.1 eV to 3.3 eV.

Then, the hole pattern is formed in the transparent electrode layer, so that a plurality of solar cells may be formed. The transparent electrodes and the high resistance buffers correspond to the cells, respectively. The transparent electrodes and the high resistance buffers may be provided in the form of a stripe or a matrix.

The transparent electrodes and the back electrodes are misaligned from each other and electrically connected with each other by the connection wires. Accordingly, the solar cells may be electrically connected to each other in series.

As described above, in order to convert the solar light into electrical energy, various solar cell apparatuses have been fabricated and used. One of the solar cell apparatuses is disclosed in Korean Unexamined Patent Publication No. 10-2008-0088744.

Meanwhile, according to the related art, when cadmium sulfide (CdS) is employed, the problem related to cadmium (Cd) occurs. Accordingly, in order to form a buffer layer without Cd, zinc sulfide (ZnS) may be used for the buffer layer. When ZnS is employed, a front electrode layer is directly deposited on the ZnS buffer layer without forming a high resistance buffer layer on the ZnS buffer layer.

However, since the ZnS buffer layer has resistance higher than that of the CdS buffer layer, the thickness of the ZnS buffer layer is restricted. Accordingly, when the front electrode layer is deposited on the ZnS buffer layer, damage may be caused to the upper portion of the buffer layer and/or the light absorbing layer.

Accordingly, the necessities for the fabrication of a buffer layer, which can solve the above problem when a ZnS buffer layer is used, and a solar cell including the buffer layer are raised.

DISCLOSURE OF INVENTION

Technical Problem

The embodiment provides a solar cell capable of improving photoelectric conversion efficiency and a method of fabricating the same.

Solution to Problem

According to the embodiment, there is provided a solar cell including a substrate, a back electrode layer on the substrate, a light absorbing layer on the back electrode layer, a buffer layer on the light absorbing layer, and a front electrode layer on the buffer layer. The buffer layer includes at least one of zinc sulfide (ZnS), zinc oxide (ZnO) and zinc hydroxide (Zn(OH)2).

According to the embodiment, there is provided a method of fabricating the solar cell. The method includes forming a back electrode layer on a substrate, forming a light absorbing layer on the back electrode layer, forming a first buffer layer on the light absorbing layer, and forming a second buffer layer on the first buffer layer. The first buffer layer or the second buffer layer includes at least one of zinc sulfide (ZnS), zinc oxide (ZnO), and zinc hydroxide (Zn(OH)$_2$).

Advantageous Effects of Invention

As described above, in the solar cell and the method of fabricating the same according to the embodiment, a plurality of buffer layers can be formed through one process. In other words, the first buffer layer including ZnS and the second buffer layer including ZnO can be formed by adjusting the concentration of the ammonia water included in the solution in the deposition process.

According to the related art, in the case of the buffer layer including ZnS, damage may be caused to the buffer layer and/or the light absorbing layer due to the thickness restriction resulting from high resistance in the subsequent process after the buffer layer has been deposited.

However, in the method of fabricating the solar cell according to the embodiment, the first buffer layer is deposited simultaneously with when the second buffer layer is deposited on the first buffer layer, by adjusting the concentration of the buffer solution in the deposition process.

Accordingly, even if the first buffer layer including ZnS has a thin thickness, since the second buffer layer is formed on the first buffer layer in order to compensate for the thin thickness of the first buffer layer, the damage, which may be caused to the buffer layer and/or the light absorbing layer in the subsequent process after the buffer laser process has been performed, can be reduced, so that the whole efficiency of the solar cell can be improved.

In addition, since at least two buffer layers can be simultaneously formed through one process, the process cost can be reduced, and the process efficiency can be improved.

BRIEF DESCRIPTION OF DRAWINGS

FIG. 1 is a plan view showing a solar cell according to the embodiment.

FIG. 2 is a sectional view showing the solar cell according to the embodiment.

FIGS. 3 to 10 are sectional views showing a method of fabricating a solar cell according to the embodiment.

MODE FOR THE INVENTION

In the following description of the embodiments, it will be understood that, when a layer (film), a region, a pattern or a structure is referred to as being "on" or "under" another substrate, layer (film), region, pad or pattern, it can be "directly" or "indirectly" on the other substrate, layer (film), region, pad, or pattern, or one or more intervening layers may also be present. Such a position of each layer will be described with reference to the drawings.

The thickness and size of each layer (film), region, pattern or structure shown in the drawings may be modified for the purpose of convenience or clarity. In addition, the size of each layer (film), region, pattern or structure does not utterly reflect an actual size.

Hereinafter, the embodiment will be described in detail with reference to accompanying drawings.

Hereinafter, a solar cell according to the embodiment will be described with reference to FIGS. 1 to 10. FIG. 1 is a plan view showing the solar cell according to the embodiment, and FIG. 2 is a sectional view showing the solar cell according to the embodiment. FIGS. 3 to 10 are sectional views showing a method of fabricating the solar cell according to the embodiment.

Referring to FIGS. 1 to 10, the solar cell according to the embodiment includes a support substrate 100, a back electrode layer 200, a light absorbing layer 300, a buffer layer 400, and a front electrode layer 500.

The support substrate 100 has a plate shape and supports the back electrode layer 200, the light absorbing layer 300, the buffer layer 400, and the front electrode layer 500.

The support substrate 100 may include an insulator. The support substrate 100 may include a glass substrate, a plastic substrate, or a metallic substrate. In more detail, the support substrate 100 may include a soda lime glass substrate. Alternatively, the support substrate 100 may include a ceramic substrate including alumina, stainless steel, or polymer having a flexible property. The support substrate 100 may be transparent. The support substrate 100 may be rigid or flexible.

The back electrode layer 200 is provided on the support substrate 100. The back electrode layer 200 is a conductive layer, and the back electrode layer 200 may include one of molybdenum (Mo), gold (Au), aluminum (Al), chrome (Cr), tungsten (W), and copper (Cu). Among then, especially, Mo makes the lower difference in the thermal expansion coefficient from the support substrate 100 when comparing with the other elements, so that the Mo represents a superior adhesive property, thereby preventing the above de-lamination phenomenon.

In addition, the back electrode layer 200 may include at least two layers. In this case, the layers may include the same metal or different metals.

The back electrode layer 200 is formed therein with first through holes TH1. The through holes TH1 are open regions to expose the top surface of the support substrate 100. When viewed in a plan view, the first through holes TH1 may have a shape to extend in a first direction.

Each of the first through holes TH1 may have the width in the range of about 80 μm to about 200 μm.

Accordingly, the back electrode layer 200 is divided into a plurality of back electrodes by the first through holes TH1. In other words, the back electrodes are defined by the first through holes TH1.

The back electrodes are spaced apart from each other by the first through holes TH1. The back electrodes are arranged in the shape of a stripe.

Alternatively, the back electrodes may be arranged in the shape of a matrix. In this case, when viewed in a plan view, the first through holes TH1 may be provided in the shape of a lattice.

The light absorbing layer 300 is provided on the back electrode layer 200. In addition, a material constituting the light absorbing layer 300 is filled in the first through holes TH1.

The light absorbing layer 300 may include a group I-III-VI-based compound. For example, the light absorbing layer 300 may have a $Cu(In,Ga)Se_2$ (CIGS) crystal structure, a $Cu(In)Se_2$ crystal structure, or a $Cu(Ga)Se_2$ crystal structure.

The light absorbing layer 300 may have an energy bandgap in the range of 1 eV to 1.8 eV.

The buffer layer 400 is provided on the light absorbing layer 300. The buffer layer 400 may include zinc sulfide (ZnS), zinc oxide (ZnO) and/or zinc hydroxide ($Zn(OH)_2$). In other words, the buffer layer 400 may include ZnS, ZnO or $Zn(OH)_2$, or may include at least one of ZnS, ZnO and $Zn(OH)_2$.

In addition, the buffer layer 400 includes first and second buffer layers 410 and 420. In detail, the first buffer layer 410 is provided on the light absorbing layer 300, and the second buffer layer 420 is provided on the first buffer layer 410. Each of the first and second buffer layers 410 and 420 may include ZnS, ZnO and/or $Zn(OH)_2$.

In addition, the concentration of sulfur (S) may be gradually reduced from the interfacial surface between the back electrode layer 200 and the light absorbing layer 300 to the interfacial surface between the light absorbing layer 300 and the buffer layer 400. In detail, the first buffer layer 410 may more include ZnS as compared with that of the second buffer layer 420. In other words, the concentration of ZnS may be gradually reduced from the first buffer layer 410 to the second buffer layer 420.

In addition, the buffer layer 410 may less include ZnO as compared with that of the second buffer layer 420. In other words, the concentration of ZnO may be increased from the first buffer layer 410 to the second buffer layer 420.

In addition, ZnS, ZnO, and $Zn(OH)_2$ may be mixed at the interfacial surface between the first and second buffer layers 410 and 420.

The buffer layer 400 may have the thickness of 30 nm to 100 nm. In detail, the first buffer layer 410 or the second buffer layer 420 may have the thickness of 50 nm or less. Preferably, the first buffer layer 410 or the second buffer layer 420 may have the thickness of 15 nm to 50 nm.

In other words, according to the embodiment, the buffer layer 400 includes the first buffer layer 410 including ZnS and the second buffer layer 420 formed on the first buffer layer 410 and including ZnO.

In addition, the first buffer layer 410 and/or the second buffer layer 420 may have the thickness of 50 nm or less based on the resistance of the ZnS buffer layer.

Accordingly, a high resistance buffer layer including ZnO can be omitted from the upper portion of the buffer layer, and the damage caused to the light absorbing layer due to the thin thickness of the buffer layer can be reduced.

The front electrode layer 500 is provided on the buffer layer 400. The front electrode layer 500 is transparent and includes a conductive layer. In addition, the front electrode layer 500 has resistance higher than that of the back electrode layer 500.

The front electrode layer 500 includes oxide. For example, a material constituting the front electrode layer 500 may include Al doped zinc oxide (AZO), indium zinc oxide (IZO), or indium tin oxide (ITO).

The front electrode layer 500 may have the characteristics of an N type semiconductor. In this case, the front electrode layer 500 forms an N type semiconductor together with the buffer layer 400 to make a PN junction with the light absorbing layer 300 serving as a P type semiconductor layer. The front electrode layer 500 may have the thickness of about 100 nm or about 500 nm.

The front electrode layer 500 may have the thickness in the range of about 500 nm to about 1.5 μm. In addition, if the front electrode layer 500 includes Al doped ZnO, the Al may be doped with the content of about 2.5 wt % to about 3.5 wt %.

The buffer layer 400 and the front electrode layer 500 are formed therein with third through holes TH3. The third through holes TH3 may be formed through a portion or an entire portion of the buffer layer 400, the high resistance buffer layer, and the front electrode layer 500. In other words, the third through holes TH3 may expose the top surface of the back electrode layer 200.

The third through holes TH3 are formed adjacent to the second through holes TH2. In detail, the third through holes TH3 are provided beside the second through holes TH2. In other words, when viewed in a plan view, the third through holes TH3 are provided in parallel to the second through holes TH2. The third through holes TH3 may have the shape extending in the first direction.

The third through holes TH3 are formed through the front electrode layer 500. In detail, the third through holes TH3 may be formed through portions or entire portions of the light absorbing layer 300 and the buffer layer 400.

The front electrode layer 500 is divided into a plurality of front electrodes by the third through holes TH3. In other words, the front electrodes are defined by the third through holes TH3.

Each front electrode has a shape corresponding to the shape of each back electrode. In other words, the front electrodes are arranged in the shape of a stripe. Alternatively, the front electrodes may be arranged in the shape of a matrix.

In addition, a plurality of solar cells C1, C2, . . . , and Cn are defined by the third through holes TH3. In detail, the solar cells C1, C2, . . . , and Cn are defined by the second and third through holes TH2 and TH3. In other words, the solar cell apparatus according to the embodiment is divided into the solar cells C1, C2, . . . , and Cn by the second and third through holes TH2 and TH3. In addition, the solar cells C1, C2, . . . , and Cn are connected to each other in a second direction crossing the first direction. In other words, current may flow through the solar cells C1, C2, . . . , and Cn in the second direction.

In other words, a solar cell panel 10 includes the support substrate 100 and the solar cells C1, C2, . . . , and Cn. The solar cells C1, C2, . . . , and Cn are provided on the support substrate 100, and spaced apart from each other. The solar cells C1, C2, . . . , and Cn are connected to each other in series by connection parts.

The connection parts are provided inside the second through holes TH2. The connection parts extend downward from the front electrode layer 500, so that the connection parts are connected to the back electrode layer 200. For example, the connection parts extend from the front electrode of the first cell C1 so that the connection parts are connected to the back electrode of the second cell C2.

Therefore, the connection parts connect adjacent solar cells to each other. In more detail, the connection parts connect front and back electrodes, which constitute adjacent solar cells, to each other.

The connection parts are integrally formed with the front electrode layer 500. In other words, a material constituting the connection parts is the same as a material constituting the front electrode layer 500.

Hereinafter, a method of fabricating the solar cell according to the embodiment will be described with reference to FIGS. 3 to 10. FIGS. 3 to 10 are sectional views to explain the method of fabricating the solar cell according to the embodiment.

Referring to FIG. 3, the back electrode layer 200 is formed on the support substrate 100. The back electrode layer 200 may be formed through a physical vapor deposition (PVD) or a plating scheme.

Thereafter, referring to FIG. 4, the first through holes TH1 are formed by patterning the back electrode layer 200. Accordingly, a plurality of back electrodes are formed on the support substrate 100. The back electrode layer 200 is patterned by a laser.

Each first through hole TH1 may expose the top surface of the support substrate 100, and have the width of about 80 μm to about 200 μm, but the embodiment is not limited thereto.

In addition, an additional layer such as an anti-diffusion layer may be interposed between the support substrate 100 and the back electrode layer 200. In this case, the first through holes TH1 expose the top surface of the additional layer.

Thereafter, referring to FIG. 5, the light absorbing layer 300 is formed on the back electrode layer 500. The light absorbing layer 300 may be formed a sputtering process or an evaporation scheme.

For example, in order to form the light absorbing layer 300, a scheme of forming a $Cu(In,Ga)Se_2$ (CIGS) based-light absorbing layer 300 by simultaneously or separately evaporating Cu, In, Ga, and Se and a scheme of performing a selenization process after forming a metallic precursor film have been extensively performed.

Regarding the details of the selenization process after forming the metallic precursor layer, the metallic precursor layer is formed on the back electrode through a sputtering process employing a Cu target, an In target, or a Ga target.

Thereafter, the metallic precursor layer is subject to the selenization process so that the $Cu(In,Ga)Se_2$ (CIGS) based-light absorbing layer 300 is formed.

In addition, the sputtering process employing the Cu target, the In target, and the Ga target and the selenization process may be simultaneously performed.

Alternatively, a CIS or a CIG light absorbing layer 300 may be formed through a sputtering process employing only Cu and In targets or only Cu and Ga targets and the selenization process.

Thereafter, referring to FIGS. 6 and 7, the buffer layer 400 is formed on the light absorbing layer 300. The step of forming the buffer layer 400 includes the steps of forming the first buffer layer on the light absorbing layer and forming the second buffer layer on the first buffer layer.

The buffer layer 400 including the first and second buffer layers 410 and 420 may be formed through a chemical bath deposition scheme.

The chemical bath deposition scheme is one of thin film deposition schemes of dipping a substrate into a solution containing a desired deposition material and depositing the deposition material on the substrate by applying heat and pressure into the substrate.

According to the method of fabricating the solar cell of the embodiment, the first and second buffer layers 410 and 420 are sequentially deposited by adjusting the concentration of the solution through the chemical bath deposition scheme. In detail, the first and second buffer layers 410 and 420 may be deposited by adjusting the concentration of ammonium hydroxide (NH4OH) contained in the solution.

In order to form the buffer layer 400 on the light absorbing layer 300, the support substrate 100 having the back electrode layer 200 and the light absorbing layer 300 may be dipped into the solution in which a buffer layer deposition material is dissolved.

The solution may include alkaline solution having pH 9 or more. The solution may include various buffer layer deposition materials.

In detail, the solution may include a Zn salt solution as a supply source of Zn. The Zn salt may include zinc sulfuric acid ($ZnSO_4$), zinc chloride ($ZnCl_2$), zinc acetate ($Zn(CH_3COO)_2$), or zinc nitrate ($Zn(NO_3)$). The solution may include thiourea ($CH_4N_2S$) as a supply source of sulfur (S). In addition, the solution includes ammonium hydroxide ($NH_4OH$) solution, that is, ammonia water as a complex compound and a pH regulator.

The ammonia water activates the deposition of ZnS on the support substrate 100. In other words, the ammonia water activates the deposition of ZnS onto the buffer layer 400 formed on the light absorbing layer 300 provided on the support substrate 100. In other words, the content of the ZnS contained in the buffer layer 400 deposited on the light absorbing layer 300 can be adjusted through the concentration of the ammonia water.

In the step of forming the first buffer layer 410, zinc sulfuric acid ($ZnSO_4$) solution and thiourea ($CH_4N_2S$) are used as sources to supply zinc and sulfur, and the ammonia water is used as the complex compound and the pH regulator. In this case, the concentration of the ammonia water may be in the range of 1 M to 4 M.

A proper amount of hydrazine hydrate solution may be added to the reaction solution in order to promote the production of zinc ions. In other words, in order to grow the ZnS thin film, reagent solutions are added in the sequence of ZnS solution, ammonia solution, hydrazine hydrate solution, and thiourea solution into a reaction container having a proper amount of deionized water therein. The temperature of the support substrate 100 having the light absorbing layer 300 may be adjusted in the range of about 50° C. to about 90° C. by using a heater installed in the reaction container.

Through the process of forming the first buffer layer 410, the first buffer layer 410 may include ZnS, ZnO, and $Zn(OH)_2$. In particular, the high content of ZnS may be contained in the first buffer layer 410, and ZnS, ZnO, and $Zn(OH)_2$ may be mixed at the interfacial surface between the first buffer layer 410 and the second buffer layer 420.

The step of forming the second buffer layer 420 on the first buffer layer 410 is performed in the same manner as the step of forming the first buffer layer 410 except for the concentration of ammonia water. In other words, in the step of forming the second buffer layer 420, the concentration of ammonia water may be in the range of 5 M to 7 M. In the case of the second buffer layer, the ammonia water is excessively added, so that the high content of $ZnOH_2$ may be contained. Since the $ZnOH_2$ exerts an influence on the bandgap to degrade the efficiency, the $ZnOH_2$ may be ionized into ZnO by performing heat treatment at the temperature of 100° C. to 300° C.

The difference in the concentration of ammonia water between the steps of forming the first and second buffer layers 410 and 420 may be in the range of 3 M to 6 M.

Through the process of forming the second buffer layer 420, the second buffer layer 420 may include ZnS, ZnO, and $Zn(OH)_2$. In particular, the high content of ZnS may be contained in the second buffer layer 420, and ZnS, ZnO, and $Zn(OH)_2$ may be mixed at the interfacial surface between the first buffer layer 410 and the second buffer layer 420.

Through the process of forming the first buffer layer 410, the first and second buffer layers 410 and 420 may include ZnS, ZnO, and $Zn(OH)_2$. In particular, the content of the ZnS may be gradually reduced from the first buffer layer 410 to the second buffer layer 420. In addition, the content of ZnO may be gradually increased from the first buffer layer 410 to the second buffer layer 420.

The process of forming the first buffer layer 410 and the process of forming the second buffer layer 420 may be consecutively performed. In other words, simultaneously with the process of depositing the first buffer layer 410, the second buffer layer 420 may be deposited by adjusting the concentration of the ammonia water of the solution The buffer layer 400 may have the thickness of 30 nm to 100 nm. In detail, the first buffer layer 410 or the second buffer layer 420 may have the thickness of 50 nm or less. Preferably, the first buffer layer 410 or the second buffer layer 420 may have the thickness of 15 nm to 50 nm.

According to the method of fabricating the solar cell of the embodiment, a plurality of buffer layers can be formed through one process. In other words, the first buffer layer including ZnS and the second buffer layer including ZnO can be formed by adjusting the concentration of the ammonia water included in the solution in the deposition process.

According to the related art, in the case of the buffer layer including ZnS, damage may be caused to the buffer layer and/or the light absorbing layer due to the thickness restriction resulting from high resistance in the subsequent process after the buffer layer has been deposited.

However, in the method of fabricating the solar cell according to the embodiment, the first buffer layer is deposited simultaneously with when the second buffer layer is deposited on the first buffer layer by adjusting the concentration of the buffer solution in the deposition process.

Accordingly, even if the first buffer layer including ZnS has a thin thickness, since the second buffer layer is formed on the first buffer layer in order to compensate for the thin thickness of the first buffer layer, the damage, which may be caused to the buffer layer and/or the light absorbing layer in the subsequent process after the buffer laser process has been performed, can be reduced, so that the whole efficiency of the solar cell can be improved.

In addition, since at least two buffer layers can be simultaneously formed through one process, the process cost can be reduced, and the process efficiency can be improved.

Thereafter, referring to FIG. 8, the second through holes TH2 are formed by partially removing the light absorbing layer 300 and the buffer layer 400.

The second through holes TH2 may be formed by a mechanical device such as a tip or a laser device.

For example, the light absorbing layer 300 and the buffer layer 400 may be patterned by a tip having a width of about 40 µm to about 180 µm. In addition, the second through holes TH2 may be formed by a laser having a wavelength of about 200 nm to about 600 nm.

In this case, the second through holes TH2 may have the width of about 100 µm to about 200 µm. In addition, the second through holes TH2 exposes a portion of the top surface of the back electrode layer 200.

Thereafter, referring to FIG. 9, the front electrode layer 500 may be formed on the buffer layer 400. For example, the front electrode layer 500 may be deposited through an RF sputtering scheme using a ZnO target, a reactive sputtering scheme using a Zn target, or an MOCVD scheme.

Thereafter, referring to FIG. 10, the third through holes TH3 are formed by partially removing the light absorbing layer 300, the buffer layer 400, and the front electrode layer 500. Therefore, the front electrode layer 500 is patterned to define a plurality of front electrodes and first to third cells C1 to C3. Each third through holes TH3 have the width of about 80 µm to about 200 µm.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A method of fabricating a solar cell, the method comprising:

forming a back electrode layer on a substrate;
forming a light absorbing layer on the back electrode layer;
forming a first buffer layer on the light absorbing layer;
forming a second buffer layer on the first buffer layer; and
forming a front electrode layer on the second buffer layer;
wherein the first buffer layer or the second buffer layer comprises at least one of zinc sulfide (ZnS), zinc oxide (ZnO), and zinc hydroxide (Zn(OH)2),
wherein in order to form the buffer layer, the substrate is dipped into the solution in which an ammonia water is dissolved
wherein the forming the first buffer layer, the concentration of the ammonia water is in the range of 1 M to 4 M,
wherein the forming the second buffer layer, the concentration of the ammonia water is in the range of 5 M to 7 M,
wherein a difference in the concentration of ammonia water between the steps of forming the first and second buffer layers is in the range of 3 M to 6 M,
wherein simultaneously with the forming the first buffer layer, the second buffer layer is formed by adjusting the concentration of the ammonia water of the solution,
wherein the second buffer layer is in direct physical contact with the front electrode layer,
wherein the first buffer layer or the second buffer layer has a thickness in a range of about 15 nm to about 50 nm.

2. The method of claim 1, wherein the first buffer layer or the second buffer layer has a thickness of about 50 nm or less.

3. The method of claim 1, wherein the first buffer layer more include ZnS as compared with that of the second buffer layer.

4. The method of claim 3, wherein the first buffer layer less include ZnO as compared with that of the second buffer layer.

5. The method of claim 1, wherein the solution comprises a supply source of Zn and S.

6. The method of claim 5, wherein the a supply source of Zn comprises zinc sulfuric acid ($ZnSO_4$), zinc chloride ($ZnCl_2$), zinc acetate ($Zn(CH_3COO)_2$), or zinc nitrate ($Zn(NO_3)$).

7. The method of claim 5, wherein the a supply source of S comprises thiourea ($CH_4N_2S$).

8. The method of claim 7, wherein the first buffer layer less include ZnO as compared with that of the second buffer layer.

* * * * *